(12) United States Patent
Miyashita et al.

(10) Patent No.: US 6,626,717 B2
(45) Date of Patent: Sep. 30, 2003

(54) MANUFACTURING METHOD OF ORGANIC EL ELEMENT

(75) Inventors: Koichi Miyashita, Nishio (JP); Takayoshi Kuriyama, Toyota (JP); Masahiko Ishii, Aichi-gun (JP)

(73) Assignee: Denso Corporation, Kariya (JP)

( * ) Notice: Subject to any disclaimer, the term of this patent is extended or adjusted under 35 U.S.C. 154(b) by 88 days.

(21) Appl. No.: 10/024,209

(22) Filed: Dec. 21, 2001

(65) Prior Publication Data

US 2002/0123291 A1 Sep. 5, 2002

(30) Foreign Application Priority Data

Dec. 27, 2000 (JP) .......................... 2000-398751

(51) Int. Cl.[7] .......................... H05B 33/10; H05B 33/14
(52) U.S. Cl. .................. 445/3; 445/6; 445/66
(58) Field of Search ............................ 445/3, 6, 66, 62, 445/23, 24, 25; 427/66; 313/512

(56) References Cited

U.S. PATENT DOCUMENTS 4,412,155 A * 10/1983 Isaka et al. ..................... 445/6
4,818,913 A * 4/1989 Isaka et al. ..................... 445/6

FOREIGN PATENT DOCUMENTS

| JP | A-5-182764 | 7/1993 | |
| JP | A-8-185979 | 7/1996 | |
| JP | A-10-208880 | 8/1998 | |
| JP | B2-2818255 | 8/1998 | |
| JP | 2001272951 A | * 10/2001 | ........... H05B/33/10 |
| JP | 2002093577 A | * 3/2002 | ........... H05B/33/10 |

* cited by examiner

*Primary Examiner*—Dean A. Reichard
*Assistant Examiner*—Angel R. Estrada
(74) *Attorney, Agent, or Firm*—Posz & Bethards, PLC

(57) ABSTRACT

In a manufacturing step for forming an organic EL element, the organic EL element is provided so as to have an anode and a cathode with a luminescent layer having an organic luminescent material interposed therebetween. Then, an aging treatment is performed. In the aging treatment, a curve of change in luminance with time is measured in driving the organic EL element at constant current. Then, the curve of change in luminance with time is divided into a component having a slowest luminance age-deterioration rate and other components by analyzing the curve and forming a fitting curve having a plurality of members that is fitted to the curve of change in luminance with time. Moreover, the aging treatment is conducted until a luminance of the element becomes approximately equal to an initial value A1 of the component having a slowest luminance age-deterioration rate.

8 Claims, 4 Drawing Sheets

MANUFACTURING METHOD OF ORGANIC EL ELEMENT

CROSS REFERENCE TO RELATED APPLICATION

This application is based upon Japanese Patent Application No. 2000-398751 filed on Dec. 27, 2000, the contents of which are incorporated herein by reference.

BACKGROUND OF THE INVENTION

1. Field of the Invention

The present invention relates to an organic electroluminescent (EL) element, specifically to an aging treatment for restraining a luminance from changing in a manufacturing method.

2. Related Art

An organic EL element includes a luminescent layer containing an organic luminescent compound that is provided between a cathode and an anode. The electrodes (cathode, anode) and the luminescent layer are formed by sputtering or deposition.

Such organic EL element is self-luminous, thereby having a high visibility. Moreover, the organic EL element can be driven at low voltage such as several voltage to several ten voltage, so that reducing weight thereof including a drive circuit can be achieved. Therefore, the organic EL element is expected to be employed to a thin film type display panel, a lighting equipment, a backlight or the like.

However, it is difficult for the organic EL element to luminesce stably for a long time. To solve this problem, such a method has been adopted that the element is covered by something to be shielded from an ambient air, a durability of the element is improved, or the electrodes are driven at lower voltage.

As one of methods relating to extend a lifetime thereof, a method is known in which luminance is prevented from deteriorating with age so that element characteristics can be stabilized by conducting an aging treatment in which a current is applied between the cathode and the anode in the manufacturing process. The method is disclosed in JP-A-05-182764, JP-A-08-185979, JP-A-10-208880.

However, in the aging method in the prior art, the study for aging time is not performed sufficiently that how long the aging should be continued. Since the aging treatment is to be lowered luminance efficiency, when the treatment is conducted excessively, even if luminance is prevent from deteriorating with age, the luminance efficiency is lowered noticeably to cause a problem in which applied voltage increases.

Moreover, the aging method, disclosed in JP-A-08-185979 described above, is conducted at room temperature. However, this method require a long time such as approximately one day even if the aging is conducted at a condition in a current density of a hundred times as large as that in activating when the element is supposed to have a half-life of ten thousands hours at practical luminance (for example, several hundreds $cd/cm^2$). This is a big problem in view of improving the efficiency in the manufacturing process of the element.

SUMMARY OF THE INVENTION

This invention has been conceived in view of the background as described above and an object of the invention is to provide a suitable aging treatment in manufacturing process of an organic EL element.

According to consideration by the inventors, a curve of change in luminance with time was measured and analyzed. Incidentally, the curve was obtained by measuring the luminance when the element is driven at constant current. The inventors found that the curve was composed of a plurality of components respectively different in luminance age-deterioration rate. The invention was made in this view.

According to a first aspect of the present invention, the curve of change in luminance with time is divided into a component of a slowest luminance age-deterioration rate and other component, and aging is conducted to such a degree that luminance of the element changes approximately equal to an initial value of the slowest luminance age-deterioration rate. By conducting such aging, in the curve, fast components of luminance age-deterioration rate in the curve are eliminated.

A change in luminance due to activation of the aged organic EL element decreases according to a deterioration rate of a component having slowest luminance age-deterioration rate, the organic EL element to be subjected to the aging treatment can be lengthen in lifetime thereof. Namely, the initial value of the slowest luminance age-deterioration rate is the best value for target luminance that indicates how long the aging should be continued.

According to the present invention, efficiency of aging time can be improved.

Preferably, when the aging is conducted, a change in luminance that is measured when the element is driven at a constant current is fitted to a curve determined by a predetermined formula.

According to another aspect of the present invention, a curve of change in luminance with time of luminance is obtained by measuring the luminance when the organic EL is driven at a constant current, and then analyzed. The curve of change in luminance with time is divided into a most dominant component in luminance age-deterioration degree and other component. Then, an aging is continued to such a degree that luminance deterioration corresponding to the most dominant component in luminance age-deterioration degree is approximately completed. By conducting this aging, in the curve, dominant components in luminance age-deterioration rate are substantially eliminated. Therefore, optimal aging can be conducted for restraining luminance of the aged element from deteriorating with age.

According to another aspect of the present invention, a curve of change in luminance with time of luminance is obtained by measuring the luminance when the organic EL is driven at a constant current, and then analyzed. The curve of change in luminance with time is divided into a component having luminance age-deterioration completed at shortest time, and other component. Then, an aging is continued to such a degree that luminance deterioration corresponding to the component having luminance age-deterioration completed at shortest time is approximately completed. By conducting this aging, in the curve, the component having luminance age-deterioration completed at shortest time is eliminated. Therefore, optimal aging can be conducted for restraining luminance of the aged element from deteriorating with age.

Preferably, the aging is conducted at a temperature between a room temperature and a temperature lower than a lowest glass-transition temperature of a material included in the organic EL element. This is because aging time can be shortened by conducting at the room temperature or more, and because the element deteriorates when the aging is conducted at higher temperature in comparison with the lowest glass transition temperature described above.

Preferably, current is applied to the element so that luminance in performing the aging exceeds practical luminance in the organic EL element to shorten the aging time.

Other features and advantages of the present invention will become more apparent from the following detailed description made with reference to the accompanying drawings.

DETAILED DESCRIPTION OF THE PREFERRED EMBODIMENT

Specific embodiments of the present invention will now be described hereinafter with reference to the accompanying drawings in which the same or similar component parts are designated by the same or similar reference numerals.

Figure 1:
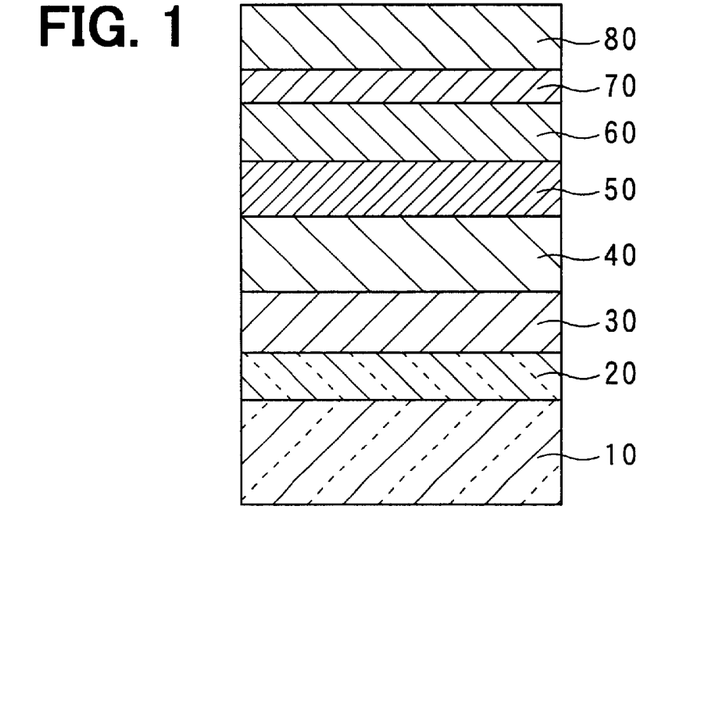
FIG. 1 is a schematic cross sectional view of an organic EL element in a first embodiment of the present invention.

Referring to FIG. 1, an anode 20 composed of a transparent conductive film such as ITO (indium tin oxide), a hole injection layer 30 and a hole transporting layer 40 each of which is composed of a material having a hole transporting property, a luminescent layer 50 composed of an organic luminescent material (a material having a hole transporting property or a material having an electron transporting property, doped with dye), an electron transporting layer 60 and an electron injection layer 70 each of which is composed of a material having an electron transporting property, and a cathode 80 composed of a metal such as aluminum (Al) are sequentially disposed on a transparent substrate 10 such as glass.

Each of the layers 20 to 80 is formed by a well-known sputtering method, depositing method or the like. By applying a predetermined direct current between the anode 20 and the cathode 80 in this organic EL element, electrons and holes are injected into the luminescent layer 50 from respective injection layers and respective transporting layers so as to cause luminance by energy generated by recombination of hole and electron at the luminescent layer 50.

Hereinafter, manufacturing method of the organic EL element shown in FIG. 1 will be described, although not limited to materials described below, by using specific examples of the materials. In this example, the substrate 10 is a glass substrate. ITO having a thickness of 300 nm is disposed as the anode 20 on one side of the glass substrate 10 by sputtering method.

On this ITO, CuPc (cupper phthalocyanine complex) as the hole injection layer 30 that has a thickness of 10 nm, TPTE (tetratriphenyl amine) as the hole transporting layer 40 that has a thickness of 30 nm are formed by using depositing method. These layers 30 and 40 are composed of an organic material having a hole transporting property as a main component.

The luminescent layer 50 is disposed on the hole transporting layer 40 by depositing method. The luminescent layer 50 is composed of Alq3 (tris (8-quinolinol) aluminum) as the material having an electron transporting property that serves as a mother material with a thickness of 20 nm which is doped with dimethylquinacridone (Qd) at a rate of 1% which serves as dye.

After that, Alq3 with a thickness of 45 nm is formed as the electron transporting layer 60, and then Lif (lithium fluoride) with a thickness of 0.5 nm is formed as the electron injection layer 70, and further Al with a thickness of 150 nm is formed as the cathode 80. Thus, the organic EL element is obtained as shown in FIG. 1.

Incidentally, after that, although not shown, the organic EL element is entirely sealed with a SUS (stainless steel) cap and a sealing resin (adhesive) in an atmosphere of nitrogen without exposing to atmospheric air. Incidentally, a size of a luminescent area is 2.5 mm×2.5 mm.

Next, an aging treatment in the present embodiment will be described. The aging is conducted by applying current between the anode 20 and cathode 80 to restrain a change in luminance with time of the organic EL element.

Figure 2:
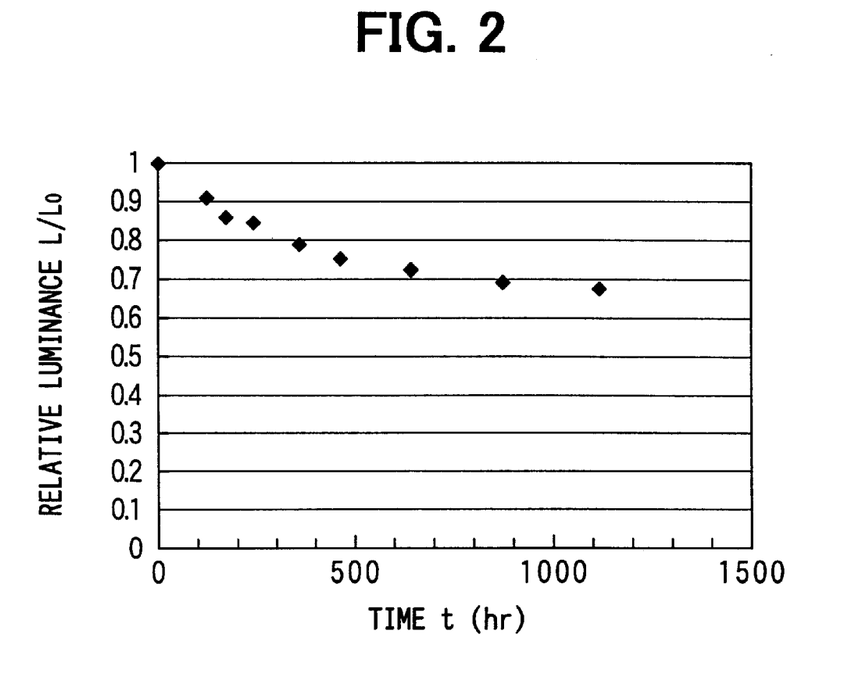
FIG. 2 is a measured result of change in luminance with time of the organic EL element in driving at constant current in the first embodiment.

First, a curve of change in luminance with time is obtained by measuring when the organic EL element is driven at a constant current (process for obtaining curve of change in luminance with time). The sealed organic EL element in the present embodiment is driven at a temperature of 85° C. by applying a constant and direct current (current density: 6.1 mA/cm$^2$), and driven successively at an initial luminance of 400 cd/cm$^2$. As shown in FIG. 2, the luminance of the element is lowered at a degree of 30% from the initial value for 700 hours. When the organic EL element is employed in a display in a vehicle, durability at high temperature is required because temperature of the vehicle becomes high reasonably. For example, as one technical standard for a vehicle, a deterioration time of a luminance deterioration of 30% from an initial luminance of 400 cd/cm$^2$ is required 1000 hours or more. However, as shown in FIG. 2, the element shown in FIG. 1 cannot satisfy the technical standard for a vehicle.

The measured data of the change in luminance with time is analyzed, and a curve of the change in luminance with time is obtained. This curve is suitably fitted to a sum of a plurality of exponential described in the formula (A) as follows.

$$L/Lo = \sum_{i=1}^{n} Ai \cdot \exp(-ki \cdot t) \quad (A)$$

wherein n is integer equal 2 or more, Ai is constant and $\Sigma Ai=1$, ki is constant, L denotes luminance at time t. Lo denotes luminance at a start of driving.

Further the aging is continued to such a degree that the luminance L satisfies a relation shown the following formula (B) when Ai of a right side member having the smallest ki is regarded as A1.

$$L=Lo \cdot (1-a+a \cdot A1) \quad (B)$$

Wherein "a" is larger than 0.

These relationships are found by the inventors. Moreover, each ki in the formula (A) becomes the constant (deterioration rate constant) designating a luminance age-deterioration, and therefore the right side member in the formula (A) is composed of a plurality of components which are different in luminance age-deterioration rate from each other.

Therefore, by comparing the deterioration rate constants ki, the curve of change in luminance with time described above is divided into a component having the slowest luminance age-deterioration rate and a component having the fastest luminance age-deterioration rate. Moreover, Ai of a component in the right side member that has the smallest deterioration rate constant ki becomes an initial value of the component with the slowest luminance age-deterioration rate.

Further, when this initial value is regarded as A1, and when the aging is continued to such the degree that the luminance L satisfies a relation shown the formula (B), the aging is supposed to be conducted to such a degree that the luminance of the organic EL element becomes substantially the same as the initial value of the component the slowest luminance age-deterioration rate.

Incidentally, the luminance of the organic EL element may become larger or smaller than the initial value at some level. Specifically, the a in the formula (B) is preferably in a range between 0.3 to 1.2.

Moreover, according to consideration of the inventors, the formula (A) is mainly composed of two or three exponential functions. Namely, "n" in the formula (A) is mainly 2 or 3 although the "n" can be four or more.

Figure 3:
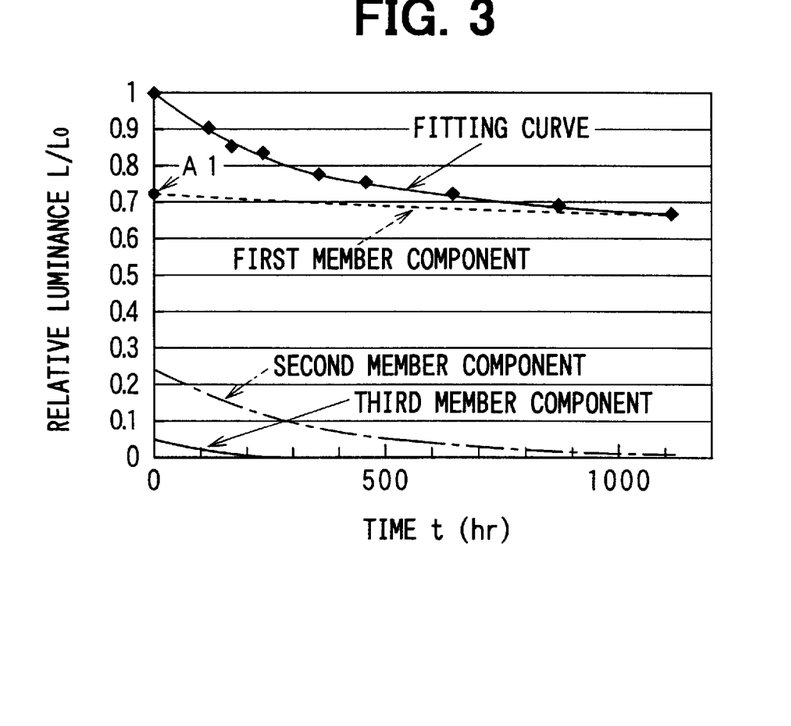
FIG. 3 is a graph showing a curve of change in luminance with time fitted to the measured result shown in FIG. 2.

Next, a formula obtained by fitting is described as follows. Moreover, the curve formed by that formula is shown in FIG. 3 with measured data.

$$L/Lo = 0.72\exp(-7.54 \times 10^{-5}t) + \quad (C)$$

$$0.24\exp(-3.25 \times 10^{-3}t) +$$

-continued
$$0.04\exp(-7.62 \times 10^{-3}t)$$

In this formula, "t" has "hour" as unit. Moreover, each of curves for three right side members described in the formula (C) is individually shown in FIG. 3.

Thus, the change in luminance with time that is measured in driving the organic EL element at the constant current is obtained as the fitted curve of change in luminance with time as described in the formula (C). The curve of change in luminance with time that is described in the formula (C) represents one example in case where "i" is equal 3 in the formula (A). The step described above denotes a process for obtaining a curve of change in luminance with time.

Next, by analyzing the curve of change in luminance with time, the component having the slowest luminance age-deterioration rate is separated from the other components. Incidentally, these components constitutes the right side member of the formula (A), that is, three components are there in the formula (C).

In this embodiment, "0.72 exp(-7.54×10$^{-5}$t)" is the first member, "0.24 exp(-3.25×10$^{-3}$t)" is the second member, and "0.04 exp(-7.62×10$^{-3}$t)" is the third member.

The deterioration rate constants ki designating a degree of the luminance age-deterioration rate are $-7.54 \times 10^{-5}$, $-3.25 \times 10^{-3}$ and $-7.62 \times 10^{-3}$ in the respective first, second and third members. The changes in luminance with time in the each member are shown in FIG. 3.

As shown in FIG. 3, the components in the second and third members are primary deterioration components in which influence to the luminance of the element is terminated in relatively short time while the component in the first member dominates the luminance deterioration in long time. Thus, by comparing the deterioration rate constant ki of the component in each member, the curve of change in luminance with time that is described in the formula (C) can be divided into the component having the slowest luminance age-deterioration rate and the other components.

Namely, in this embodiment, the component of the first member in the formula (C) corresponds to the component having the slowest luminance age-deterioration rate, and the components of the second and third members correspond to the other components. This fact indicates that the first member in the formula (C) corresponds a member in the right side member that has the smallest ki. Moreover, Ai in the member having the smallest ki is a coefficient of 0.72 in the first member. The step described above denotes a process for dividing a curve.

Incidentally, it is supposed that deterioration dominating the luminance deterioration in long time in the first member is caused by a chemical reaction in which an organic material composing the organic EL element is changed into a partial restrained luminance specie in oxidation-reduction reaction when carrying electrons that is involved in driving. On the other hand, it is supposed that the component of the third member which has a shortest time constant is deterioration caused by an internal polarization in an organic layer by the applied voltage or an effective decrease in electric field involved in forming internal electric field by impurity ions.

Although it is not clear at the present stage that what kinds of mechanism cause the component of the second member, it is supposed that the component is deterioration to which doping luminescent dye into the luminescent layer may be related from a basis that it is able to use sum of two exponential for fitting in an element having the luminescent layer with which the dye is not doped that is described in the following second embodiment.

According to the above-mentioned analysis, it is expected to restrain the luminance from being lowered and to improve durability of the element by eliminating deterioration components in the second and third member by the aging treatment. Therefore, the aging is conducted to such a degree that luminance of the element is lowered approximately equal to an initial value of the component having the slowest luminance age-deterioration rate (aging process).

Specifically, in this embodiment, the aging is conducted in a condition where current density is 108 mA/cm$^2$ so as to be an initial luminance of 8000 cd/cm$^2$, at 85° C. The aging is continued until the relative luminance L/Lo becomes equal to the coefficient of 0.72 in the first member that corresponds to the initial value of A1 in the component having the slowest luminance age-deterioration rate. That is, the aging is conducted until the luminance is lowered to 5760 cd/cm$^2$. This is a process for aging.

Figure 4:
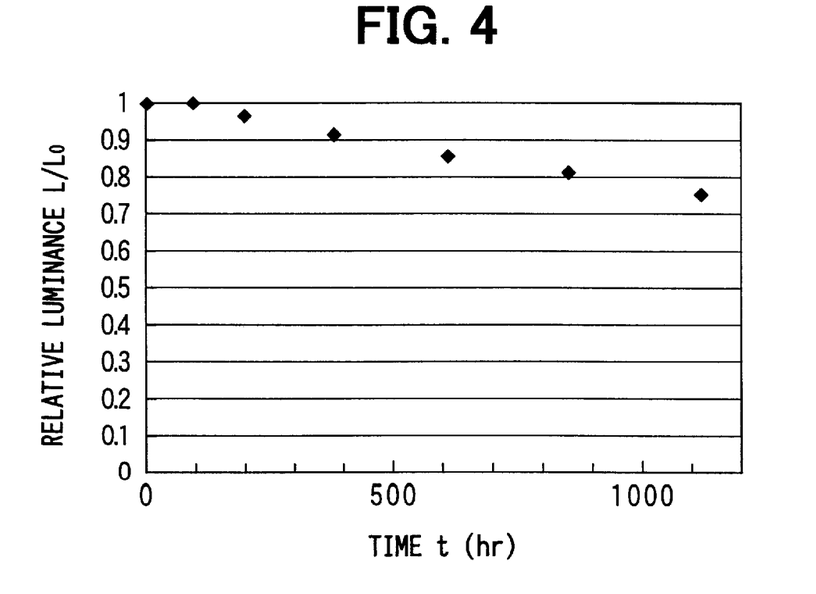
FIG. 4 is a measured result of change in luminance with time after the aging in the first embodiment.

After that, the change in luminance with time is measured in a condition of an initial luminance of 400 cd/cm$^2$, at 85° C. to check an effect of aging in the organic EL element. The measured result is shown in FIG. 4. Even if after 1120 hours has elapsed, the luminance of the element shows 300 cd/cm$^2$, a rate of luminance deterioration is at 25%. This satisfies the vehicle technical standard described above.

As described above, the main feature of the present embodiment is characterized in that the curve of change in luminance with time (the formula (C)) is obtained which is measured in driving the organic EL element at the constant current, this curve is analyzed to divide into the component having the slowest luminance age-deterioration rate (the first member of the formula (C)) and the other components, and then the aging is conducted until the luminance of the element is substantially lowered equal to the initial value (the coefficient of 0.72 in the first member) of the component having the slowest luminance age-deterioration rate.

According to the present embodiment, the components (primary deterioration components) having fast luminance age-deterioration rate in the curve of change in luminance with time in activating can be eliminated from the curve by aging. This is because the aging is conducted until the luminance of the element is substantially lowered equal to the initial value of the component having the slowest luminance age-deterioration rate.

Moreover, since change in luminance caused in driving the aged organic EL element is lowered according to the deterioration rate (deterioration rate constant of $-7.54 \times 10^{-5}$ in the first member) of the component having the slowest luminance age-deterioration rate, luminance lifetime of the aged organic EL element can be lengthened as long as possible.

Thus, according to the present embodiment, an optimum target in aging is previously obtained which is the initial value of the component having the slowest luminance age-deterioration rate, and then the aging is conducted. Therefore, such a problem can be eliminated that the aging is conducted very little or too much. As a result, an aging time can be made efficient at the most and the aging condition can be optimized.

In this embodiment, the aging is conducted until the relative luminance L/Lo is lowered equal to the coefficient of 0.72 in the first member. In other words, the aging is conducted in a condition where A1 is equal to 0.72, and a is equal to 1 in the following formula (D).

$$L=Lo(1-a+aA1) \ (a>0) \quad (D)$$

Incidentally, the aging may be conducted so that the coefficient of 0.72 in the first member is regarded as an original target and luminance which is deviated from the original target to greater or lesser degree is regarded as a target to be achieved.

In other words, it is not necessarily to conduct the aging in a condition where the a is equal to 1, and therefore the aging may be conducted in a condition where the a is smaller or larger than 1. However, when the a is considerably small, that is, when the relative luminance L/Lo is considerably large, there is possibility that aging effect for eliminating primary deterioration components is insufficient.

On the other hand, when the a is considerably large, that is, when the relative luminance L/Lo to be a target of the aging is considerably small, the deterioration of the first member progresses so as to cause deterioration of the element efficient. As a result, durability deteriorates rather than it is improved. Therefore, in many cases, an aging is preferably conducted in a condition where a in the formula (D) is a value between 0.3 and 1.2.

Moreover, an aging may be conducted at room temperature.

However, since it takes for long time to conduct the aging at room temperature, the aging at room temperature is not good in view of manufacturing process efficiency. Therefore, an aging is preferably conducted at a high temperature higher than ordinary temperature (ex. 25° C.) to shorten the aging time.

However, even if it is higher than ordinary temperature, an aging should be conducted at a temperature lower than lowest glass-transition temperature Tg of a material in the organic EL element. When the aging is conducted at a temperature higher than the glass-transition temperature, the element deteriorates.

In fact, when practical luminance is supposed to be at 400 cd/cm 2, and when the aging is conducted at luminance of twenty times, i.e., 8000 cd/cm$^2$, it takes 21 hours to lower the luminance of the element to 5760 cd/cm$^2$ by aging at room temperature while it takes 3 hours to lower the luminance of the element to 5760 cd/cm2 by aging at 85° C.

Incidentally, when an aging is conducted, current is preferably applied so that luminance is equal to practical luminance or more (e.x., 2 to 10000 times as large as the practical luminance) in the organic EL element to shorten the aging time. In fact, in the example shown in FIG. 2, the current is applied so that the initial luminance is 400 cd/cm$^2$ at 85° C. As a result, it takes several hundreds hours to lower the luminance at a degree of 30%.

Second Embodiment

Figure 5:
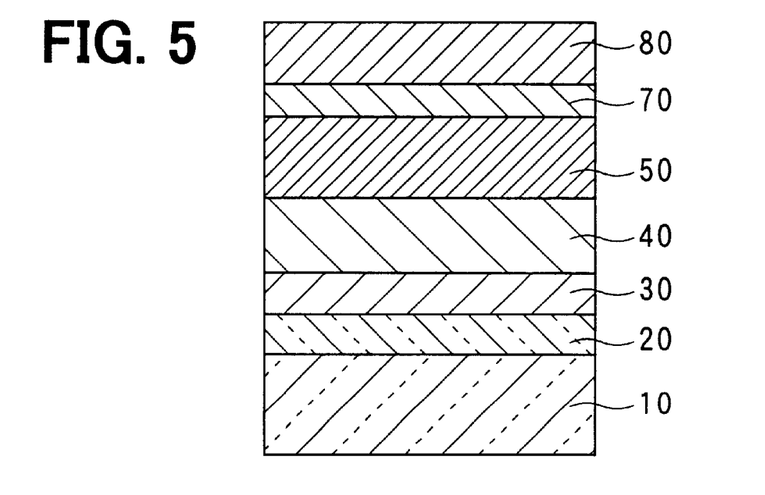
FIG. 5 is a schematic cross sectional view of an organic EL element in a second embodiment of the present invention.

Referring to FIG. 5, a luminescent layer 50 serves as an electron transporting layer and is not doped with dye as compared to the organic EL element in the first embodiment.

A manufacturing method of an organic EL element in this embodiment will be described while showing specific materials. An anode 20 composed of an ITO with a thickness of 300 nm, a hole injection layer 30 composed of CuPc with a thickness of 10 nm, and a hole transporting layer 40 composed of TPTE with a thickness of 0.5 nm are successively disposed on a glass substrate 10.

On this structure, the luminescent layer 50 is disposed which is composed of Alq3 with a thickness of 60 nm, and an electron injection layer 70 composed of LiF with a thickness of 0.5 nm, a cathode 80 composed of aluminum with a thickness of 150 nm are disposed on the luminescent layer 50 to form the organic EL element shown in FIG. 5. The element is also sealed as described in the first embodiment.

Figure 6:
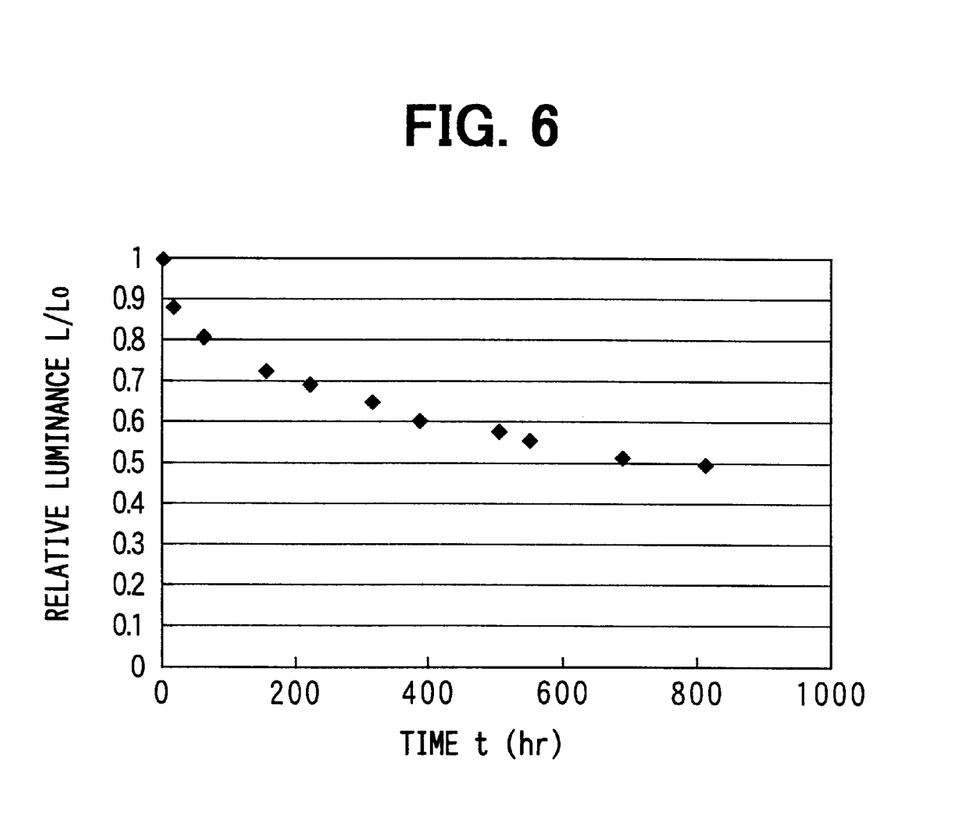
FIG. 6 is a measured result of change in luminance with time of the organic EL element in driving at constant current in the second embodiment.

Next, an aging is conducted to the organic element in this embodiment by applying current between the anode 20 and cathode 80 to restrain luminance from changing with time. First, the organic EL element in the present embodiment is driven at a temperature of 85° C. by applying a constant and direct current (current density: 9.8 mA/cm$^2$), and driven successively at an initial luminance of 400 cd/cm$^2$. As shown in FIG. 6, luminance is lowered at a degree of 30% from the initial value for 200 hours.

Figure 7:
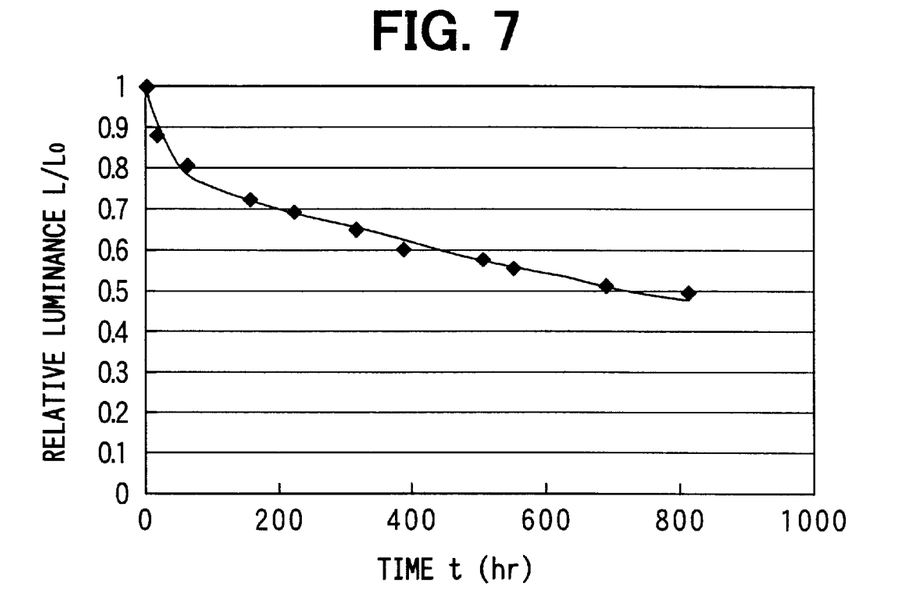
FIG. 7 is a graph showing a curve of change in luminance with time fitted to the measured result shown in FIG. 6.

When a function formula (formula (A)) determined by a sum of exponential is tried to be fitted to the measured result shown in FIG. 6, a sum of two exponential is suitably fitted to the measured data. A formula (E) obtained by fitting is described as follows. Moreover, the curve formed by that formula is shown in FIG. 7 with the measured data.

$$L/Lo = 0.79\exp(-6.25\times10^{-4}t) +$$
$$0.21\exp(-3.24\times10^{-2}t)$$
(E)

Wherein L, Lo and t in the formula (E) are the same as the formula (C) described above.

Thus, the change in luminance with time that is measured in driving the organic EL element at the constant current is obtained as the curve of change in luminance with time that is fitted as described in the formula (E). The curve of change in luminance with time that is described in the formula (E) represents one example in case where "i" is equal 2 in the formula (A). The step described above denotes a process for obtaining the curve of change in luminance with time.

Next, the curve is divided into components. In this embodiment, the curve has two components. This is supposed that, different from the first embodiment, primary deterioration component which is supposed due to doping of dye does not appear by not doping the dye to the luminescent layer 50, and therefore the sum of two exponential is suitably fitted to the curve.

A first member, $0.79 \exp(-6.25\times10^{-4}t)$, of the right side member in the formula that has a smallest deterioration rate constant ki of $-6.25\times10^{-4}$ is a component having the slowest luminance age-deterioration rate and a component in the right side member of the formula (A) that has a smallest ki. The Ai of the component having the smallest ki (i.e., initial value A1 described above) is a coefficient of 0.79 in the first member. The step described above is a step for dividing curve.

Next, the aging is conducted in a condition where current density is 186 mA/cm$^2$ so as to be an initial luminance of 8000 cd/cm$^2$, at 85° C. until the relative luminance L/Lo becomes equal to the coefficient of 0.79 in the first member. That is, the aging is conducted until the luminance is lowered to 6320 cd/cm$^2$. This is a process for aging.

Figure 8:
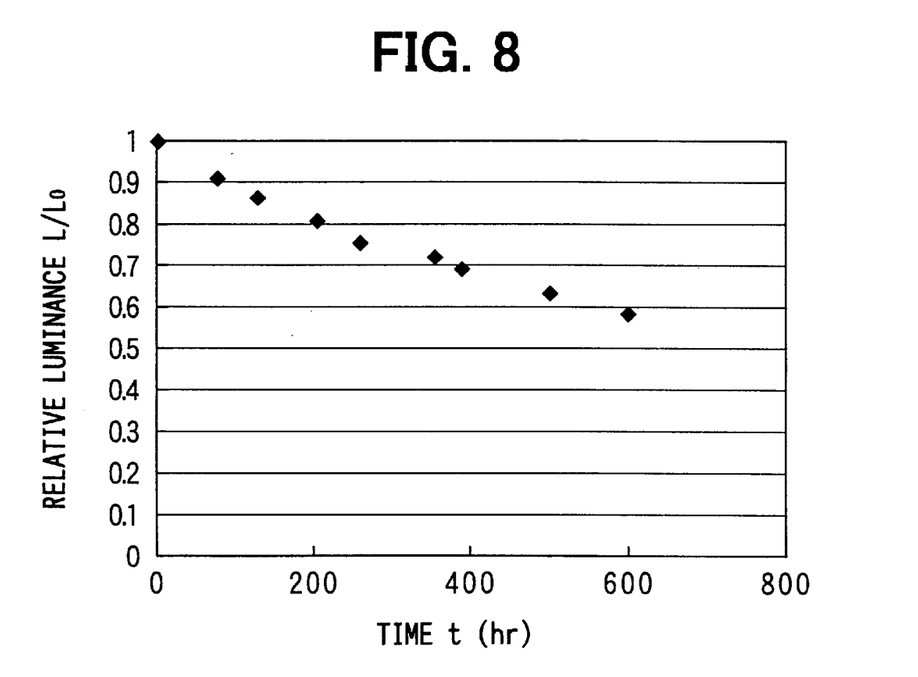
FIG. 8 is a measured result of change in luminance with time after the aging in the second embodiment.

After that, the change in luminance with time is measured in a condition of an initial luminance of 400 cd/cm$^2$, at 85° C. to check an effect of aging in the organic EL element. The measured result is shown in FIG. 8. A rate of luminance deterioration is at 30% for 375 hours. This denotes that lifetime of the element is lengthened approximately two times as long as that before the aging is conducted.

As described above, similar effect to the first embodiment can be obtained. Moreover, an aging in this embodiment is preferably conducted in a condition where a in the formula (D) is a value between 0.3 and 1.2. Further, the effect for shortening the aging time due to high temperature and high luminescent is similar to the first embodiment.

Incidentally, in the first embodiment, the curve of change in luminance with time (the formula (C)) is obtained which is measured in driving the organic EL element at the constant current, this curve is analyzed to divide into the most dominant component of luminance age-deterioration degree and the other components, and then the aging may be conducted until luminance deterioration in the most dominant component of luminance age-deterioration degree is almost completed.

Namely, in the formula (C), the component of second member is the most dominant component of luminance age-deterioration degree as can be understood from FIG. 3 by comparing the fitting curve and each curve of the first, second and third members. Therefore, to conduct aging treatment until the luminance deterioration in the second member is almost completed denotes that the aging treatment is conducted until the relative luminance L/Lo becomes zero (zero point) in FIG. 3 (for performing this aging, although it takes approximately 1000 hours as shown in FIG. 3, the aging time can be shortened by using acceleration with luminance.).

The relative luminance L/Lo in the curve of change in luminance with time (the fitting curve) is approximately 0.67 in FIG. 3 that is associated with the zero point described above. Namely, the second member can be eliminated by aging so that the relative luminance L/Lo of 0.67 is regarded as a target.

Thus, the most dominant component of luminance age-deterioration degree is obtained before the aging treatment, the aging is conducted so that this dominant component is regarded as the target, whereby luminance lifetime of the organic EL element can be lengthened as long as possible and the aging can be conducted at an optimum condition to restrain the luminance of the aged element from deteriorating.

Moreover, in the first embodiment, the curve of change in lids luminance with time (the formula (C)) is obtained which is measured in driving the organic EL element at the constant current, this curve is analyzed to divide into a component in which luminance age-deterioration is completed at shortest time and the other components, and then the aging may be conducted until luminance deterioration in the component having luminance age-deterioration which is completed at shortest time is almost completed.

Namely, in the formula (C), the component of the third member is the component having luminance age-deterioration which is completed at shortest time. Therefore, to conduct aging treatment until the luminance deterioration in the third member is almost completed denotes that the aging treatment is conducted until the relative luminance L/Lo becomes zero (zero point) in FIG. 3 (for performing this aging, although it takes approximately 200 hours as shown in FIG. 3, the aging time can be shortened by using acceleration by luminance.).

The relative luminance L/Lo in the curve of change in luminance with time (the fitting curve) is approximately 0.84 in FIG. 3 that is associated with the zero point described above. Namely, the third member can be eliminated by aging so that the relative luminance L/Lo of 0.84 is regarded as a target.

Thus, the component having luminance age-deterioration which is completed at shortest time is obtained before the aging treatment, the aging is conducted so that this component is regarded as the target, whereby the aging can be conducted at an optimum condition to shorten the aging time at most.

Incidentally, when the aging treatment is conducted until the luminance deterioration in the most dominant component of luminance age-deterioration degree or in the component having luminance age-deterioration which is completed at shortest time, the aging should be conducted at a temperature lower than lowest glass-transition temperature of a material in the organic EL element. Furthermore, when the aging is conducted, current is preferably applied so that luminance is equal to practical luminance or more.

Incidentally, in this specification, the term "approximately equal to" denotes that a range between −20% and +20% with respect to the initial value of the component in which the luminance age-deterioration rate is slowest can be permitted, and this range is preferably between −10% and +10%. Moreover, the term "almost completed" denotes that a range between −20% and +20% with respect to time in which the luminance deterioration is completed, and this range is preferably between −10% and +10%.

While the present invention has been shown and described with reference to the foregoing preferred embodiment, it will be apparent to those skilled in the art that changes in form and detail may be therein without departing from the scope of the invention as defined in the appended claims.

What is claimed is:

1. A manufacturing method of organic EL element, comprising the steps of:
   forming an organic EL element so as to have an anode and a cathode with a luminescent layer having an organic luminescent material interposed therebetween, and
   aging the organic EL element by applying current to the organic EL element structure, wherein the aging step comprises the steps of:
   forming a curve of change in luminance with time that is measured in driving the organic EL element at constant current;
   dividing the curve of change in luminance with time into a component having a slowest luminance age-deterioration-rate and other component by analyzing the curve of change in luminance with time; and
   performing the aging until a luminance of the organic EL element becomes approximately equal to an initial value of the component having a slowest luminance age-deterioration rate.

2. A manufacturing method of organic EL element according to claim 1, wherein the aging step is conducted at a temperature higher than an ordinary temperature but lower than a lowest glass-transition temperature of a material included in the organic EL element.

3. A manufacturing method of organic EL element according to claim 1, wherein the current is applied so that a luminance of the organic EL element becomes equal to a practical luminance or more in the aging step.

4. A manufacturing method of organic EL element, comprising the steps of:
   forming an organic EL element so as to have an anode and a cathode with a luminescent layer having an organic luminescent material interposed therebetween, and
   aging the organic EL element by applying current to the organic EL element, wherein the aging step comprises the steps of:
   measuring change in luminance of the organic EL element with time;
   fitting the change in luminance of the organic EL element with time to a first formula which is described as:

$$L/Lo = \sum_{i=1}^{n} Ai \cdot \exp(-ki \cdot t)$$

wherein n is an integer equal 2 or more, Ai is a constant and $\Sigma Ai=1$, ki is a constant, L denotes luminance at time t, Lo denotes a luminance at a start of driving the organic EL element;
   performing an aging treatment so that when Ai of a component having a smallest ki in a right member of the first formula is regarded as A1, the luminance L becomes a value satisfying a relation in a second formula which is described as:

$L=Lo \cdot (1-a+a \cdot A1)$, wherein $a>0$.

5. A manufacturing method of organic EL element according to claim 4, wherein:
   the a in the first formula is in a range between 0.3 to 1.2.

6. A manufacturing method of organic EL element according to claim 4, wherein:
   the n in the first formula is 2 or 3.

7. A manufacturing method of organic EL element, comprising the steps of:
   forming an organic EL element so as to have an anode and a cathode with a luminescent layer having an organic luminescent material interposed therebetween, and
   aging the organic EL element by applying current to the organic EL element structure, wherein the aging step comprises the steps of:
   forming a curve of change in luminance with time that is measured in driving the organic EL element at constant current;
   dividing the curve of change in luminance with time into a most dominant component of a luminance age-deterioration degree and other component by analyzing the curve of change in luminance with time; and performing an aging treatment until a luminance deterioration in the most dominant component of a luminance age-deterioration degree is almost completed.

8. A manufacturing method of organic EL element, comprising the steps of:

forming an organic EL element so as to have an anode and a cathode with a luminescent layer having an organic luminescent material interposed therebetween, and aging the organic EL element by applying current to the organic EL element structure, wherein the aging step comprises the steps of:

forming a curve of change in luminance with time that is measured in driving the organic EL element at constant current;

dividing the curve of change in luminance with time into a component having a luminance age-deterioration degree which is completed at shortest time and other component by analyzing the curve of change in luminance with time; and performing an aging treatment until a luminance deterioration in the component having a luminance age-deterioration degree which is completed at shortest time is almost completed.

* * * * *